United States Patent [19]
Kasuga

[11] Patent Number: 4,521,867
[45] Date of Patent: Jun. 4, 1985

[54] IIR DIGITAL FILTER HAVING LOW COEFFICIENT SENSITIVITY

[75] Inventor: Masao Kasuga, Sagamihara, Japan

[73] Assignee: Victor Company of Japan, Limited, Japan

[21] Appl. No.: 410,710

[22] Filed: Aug. 23, 1982

[30] Foreign Application Priority Data

Aug. 24, 1981 [JP] Japan ................ 56-132306

[51] Int. Cl.³ .................. G06F 7/38; H03H 7/28
[52] U.S. Cl. .................... 364/724; 333/166
[58] Field of Search ............. 364/724; 333/165-167

[56] References Cited

U.S. PATENT DOCUMENTS

| | | | |
|---|---|---|---|
| 3,727,153 | 4/1973 | McAuliffe | 333/166 |
| 4,185,325 | 1/1980 | Appel | 333/166 |
| 4,250,472 | 2/1981 | Hashimoto | 333/166 |

OTHER PUBLICATIONS

Avenhaus, Ernst, "A Proposal to Find Suitable Canoical Structures for the Implementation of Digital Filters With Small Coefficient Wordlength", NTZ, 15, 8, pp. 377-382.

Agarwal, Ramesh et al, "New Recursive Digital Filter Structures Having Very Low Sensitivity and Roundoff Noise", IEEE.

*Primary Examiner*—James D. Thomas
*Assistant Examiner*—Dale M. Shaw
*Attorney, Agent, or Firm*—Lowe, King, Price & Becker

[57] ABSTRACT

Input discrete samples $x_n$ are applied to an adder through a first set of feedforward paths which successively delay and multiply the samples by selected coefficient values and are also applied to an adder-subtractor through a second set of feedforward paths which successively delay and shift the input samples by selected values. Output discrete samples $y_n$ are supplied from the adder-subtractor to the adder through a first set of feedback paths by successively delaying and scaling the samples by selected values of coefficient and are also applied to the adder-subtractor through a second set of feedback paths by successively delaying and shifting the samples by selected values. The samples applied to the adder are combined into a first signal representing an integer part of the filter coefficient, while those applied to the adder-subtractor are combined into a second signal representing a fractional part of that coefficient, the first and second signals being combined in the adder-subtractor to provide the output samples $y_n$. Bit shifting means is provided for shifting samples which appear in any location of the filter to provide the first signal.

8 Claims, 11 Drawing Figures

IIR DIGITAL FILTER HAVING LOW COEFFICIENT SENSITIVITY

BACKGROUND OF THE INVENTION

The present invention relates to digital filters, and in particular to an Infinite Impulse Response (IIR) digital filter for filtering a sequence of discrete samples of a digital signal with low coefficient sensitivity.

Digital recording and playback systems for processing a digital signal of equally spaced pulse samples such as pulse-code modulated (PCM) signals usually make use of attenuators and equalizers comprising digital filters for purposes of modifying the signal level and frequency response characteristic of the system. Digital filters are broadly divided into Infinite Impulse Response digital filters and Finite Impulse Response (FIR) digital filters. While the FIR digital filter has no stability problems due to the absence of a feedback loop and provides a linear phase characteristic, complex circuits result due to the large value of filter order. On the other hand, the IIR digital filter can be constructed with a filter order ten times less than the FIR filter although the phase linearity is not guaranteed.

IIR digital filters are classified into direct form and canonical form according to their internal connections and structures which are respectively shown in FIGS. 1a and 1b in which a sequence of input discrete samples $x_n$ at time nT is translated into a sequence of output discrete samples $y_n$ at time nT (where T is the sampling interval). The direct form IIR digital filter of FIG. 1a comprises a feedforward circuit including cascaded delay circuits each providing a unit delay time represented by $Z^{-1}$ and an multiplier having a coefficient $a_2$ for multiplying the delayed input samples $x_n$ by a coefficient $a_2$. Multipliers having coefficients $a_0$ and $a_1$ are respectively coupled from the inputs of the feedforward delay circuits to an adder. A feedback circuit is provided comprising cascaded feedback delay circuits each providing a unit delay time to the output samples from the adder and multipliers having coefficients $-b_1$ and $-b_2$ respectively coupled from the outputs of the feedback delay circuits to the adder. The canonical IIR digital filter, FIG. 1b, comprises a pair of first and second adders and a pair of multipliers coupled in series between input and output terminals. A pair of feedback circuits including a pair of unit delay circuits in a common path connected from the output of the first adder and multipliers is provided to apply feedback signals to the inputs of the first adder. A pair of feedforward circuits including the common delay circuits and a pair of multipliers is coupled from the output of the first adder to the inputs of the second adder.

These types of digital filter have an inherent limitation in coefficient wordlength and require that the poles and zeros of the transfer function must be shifted for finite length quantization as in the case of FIR digital filters. For this reason, the coefficient quantization results in a deviation of the actual transfer function from desired values, thus resulting in the deviation of gain and frequency response characteristic from those desired. According to the description of "Digital Processing of Signals", McGraw-Hill, 1969 by B. Gold and C. M. Rader, the characteristics of a digital equalizer is highly sensitive when the allowable root locations have low density distribution in the z-plane as indicated by a hatched area I in FIG. 3, if the center frequency of the filter is low and the Q value is high.

If it is assumed that a digital equalizer is constructed using the IIR digital filter of FIG. 1a in a manner as shown and described in Japanese Patent Publication (Tokkaisho) 56-120211 filed by the same applicant as the present invention (with the center frequency fo=20 Hz, Q=3, signal level L=12 dB at fo with a sampling frequency 44.0569 kHz), frequency response characteristics as shown in FIG. 2 will be obtained for different wordlengths. As is evident from FIG. 2, the curves obtained for wordlengths larger than 25 correspond to design values, while other curves for smaller coefficient wordlengths increasingly deviate from the ideal with decrease in wordlength.

Although small coefficient wordlength is favored for economy purposes, this results in the undesirable circumstances just described. On the other hand, a longer wordlength would require many multipliers. Various attempts have thus far been made to reduce the coefficient sensitivity of the digital filter.

One typical prior art approach is described in "A Proposal to Find Suitable Canonical Structures for the Implementation of Digital Filters with Small Coefficients Wordlength", NTZ, 25, 8, pages 377–382, 1972, by E. Avenhouse. This method is based on the fact that the root positions have a uniform density distribution entirely in the z-plane. However, the disadvantages are a high degree of freedom of implementation and a greater number of multiplication operations than direct form digital filters.

A second approach to small coefficient sensitivity is proposed by R. G. Agarwal and C. S. Burrus in "New Recursive Digital Filter Structures Having Very Low Density Sensitivity and Roundoff Noise", IEEE Transactions, CAS-22 (December 1975). This method is concerned with digital filters of second-order low coefficient sensitivity and proposes two alternatives for narrow bandwidth filters in which the sensitivity problem is particularly severe. According to one such alternative the poles of the transfer function $H(z^{-1})$ given by Equation 1 are represented by coefficients given in Equation 2 as follows:

$$H(z^{-1}) = \frac{a_0}{1 + a_1 z^{-1} + b_1 z^{-2}} \quad (1)$$

$$\left. \begin{array}{l} a_1 \simeq 2\delta + ^{-2} \\ b_1 \simeq 2\delta \\ \delta \simeq 1 - r \end{array} \right\} \quad (2)$$

where, r=radial distance of z-plane poles from the point of origin and 0=angle of the poles to the real axis.

Being an approximation, this method lacks accuracy and has the disadvantage of high degree of implementation freedom. The second alternative involves substituting $1-z^{-1}$ for $z^{-1}$ in Equation 1 in order to provide small coefficient sensitivity in the low frequency range of the spectrum while having high coefficient sensitivity in the high frequency range. Since small coefficient sensitivity could not be obtained, this alternative method is also unsatisfactory for requirements that small coefficient sensitivity be effective over the full frequency range of the spectrum.

A third approach to small coefficient sensitivity is proposed by A. Nishihara in "Low-Sensitivity Digital Filters with a Minimal Number of Multipliers", described in a technical journal published by the Institute of Electronics and Communication Engineers of Japan, September 1978 and A. Nishihara and Y. Moriyama in "Minimization of Sensitivities in Digital Filters by Coefficient Conversion", described in an August 1968 journal of the IECE. Similar to the Avenhouse method, this approach is concerned with narrow bandwidth filter structures where the density of allowable root locations of the bandwidth does not decrease in areas close to z=1 to a level lower than the density for other frequencies. However, the problem is a high degree of implementation freedom, which is disadvantageous for universal applications. Furthermore, the coefficient sensivity is evaluated in terms of amplitude sensitivity. Since the latter is variable as a function of frequency it is difficult to determine at which frequency the sensitivity evaluation is to be made.

SUMMARY OF THE INVENTION

The primary object of the present invention is therefore to provide an IIR digital filter for filtering a sequence of discrete samples of a digital signal with low coefficient sensitivity to minimize multiplication operations.

It is a feature of the present invention to provide an IIR digital filter which can be designed to meet universal frequency equalization characteristics with a small coefficient wordlength.

It is a further feature of the invention to provide an IIR digital filter which is free from truncation and rounding of digital samples.

It is a further feature of the invention to provide an IIR digital filter in which input discrete samples $x_n$ are applied to an adder through a first set of feedforward paths which successively delay and multiply the samples by selected values of coefficient. The input samples are further applied to an adder-subtractor through a second set of feedforward paths which successively delay and shift the input samples by selected values. Output discrete samples $y_n$ are supplied from the adder-subtractor to the adder through a first set of feedback paths by successively delaying and scaling the samples by selected coefficient values and are also applied to the adder-subtractor through a second set of feedback paths by successively delaying and shifting the samples by selected values. The samples applied to the adder are combined into a first signal representing an integer part of the filter coefficient, while those applied to the adder-subtractor are combined into a second signal representing a fractional part of that coefficient, the first and second signals being combined in the adder-subtractor to provide the output samples $y_n$. Bit shifting means is provided for shifting samples which appear in any location of the filter so that the first signal is shifted by a predetermined value.

More specifically, the digital filter is adapted for filtering a digital input signal representative of a sequence of discrete samples $x_n$ to generate a sequence of discrete output samples $y_n$ according to a transfer function $$\sum_{K=0}^{N} b_K \cdot y_{(n-K)} = \sum_{K=0}^{M} a_K \cdot x_{(n-K)}$$

where, $a_K$ and $b_K$ are weighing factors.

According to the invention, the weighting factors $a_K$ and $b_K$ are given by $$a_K = A_K \pm \hat{\alpha}_{Ki} 2^{-i}$$

$$b_K = B_K \pm \hat{\beta}_{Ki} 2^{-j}$$

where, $A_K$ and $B_K$ are integers, $\hat{\alpha}_{Ki} \cdot 2^{-i}$ and $\hat{\beta}_{Ki} \cdot 2^{-j}$ are fractions, $\hat{\alpha}_{Ki}$ and $\hat{\beta}_{Ki}$ are weighting factors, and i, j are constants. For purposes of minimizing coefficient wordlength and obtaining low coefficient sensitivity, the transfer function is rewritten as $$\sum_{K=0}^{N} B_K \cdot y_{(n-K)} = \sum_{K=0}^{M} A_K \cdot x_{(n-K)} \pm$$

$$2^{-i} \left\{ \sum_{K=0}^{M} \alpha_{Ki} \cdot x_{(n-K)} \mp \sum_{K=0}^{N} \beta_{Ki} \cdot 2^{i-j} \cdot y_{(n-K)} \right\}$$

The digital filter of the invention comprises a first feedforward means for successively delaying and scaling the input signal by selected values $\hat{\alpha}_{Ki}$ to provide a plurality of first feedforward signals, first combining means for providing a first combined signal representing $$2^{-i} \left\{ \sum_{K=0}^{M} \alpha_{Ki} \cdot x_{(n-K)} \pm \sum_{K=0}^{N} \beta_{Ki} \cdot 2^{i-j} \cdot y_{(n-K)} \right\}$$

in response to the combining of the first feedforward signals and a plurality of first feedback signals, second feedforward means for successively delaying and shifting the input signal $x_n$ by selected values to provide a plurality of second feedforward signals, second combining means for providing a second combined signal representing $$\sum_{K=0}^{N} B_K \cdot y_{(n-K)} \pm \sum_{K=0}^{M} A_K \cdot x_{(n-K)}$$

in response to the combining of the second feedforward signals and a plurality of second feedback signals and providing the output signal $y_n$ in response to the combining of the first and second combined signals. Further included is a first feedback means coupled to the second combining means for successively delaying and scaling the second combined signal by selected values $\hat{\beta}_{Ki}$ to provide the first feedback signals. A second feedback means is coupled to the second combining means for successively delaying and shifting the second combined signal by selected values to provide the second feedback signals. Bit shifting means is provided to shift discrete samples that occur in any one of circuits to the feedforward, feedback and combining means so that the first combined signal is shifted by a predetermined value.

BRIEF DESCRIPTION OF THE DRAWINGS

The present invention will be described in detail with reference to the accompanying drawings, in which.

DETAILED DESCRIPTION

Figure 1A:
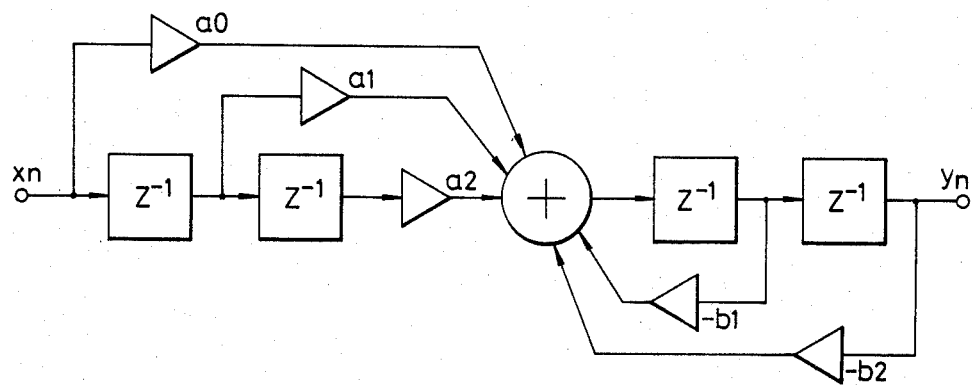
FIGS. 1a and 1b show block diagrams of prior art IIR digital filters of the direct and canonical forms, respectively.

Prior to describing the operation of the IIR digital filter of the invention, the underlying principle of the digital filter will be described using the transfer function disclosed in the aforesaid Japanese Patent Publication. This transfer function is given as follows $$H(z^{-1}) = a_0 \frac{1 + a_1 z^{-1} + a_2 z^{-2}}{1 + b_1 z^{-1} + b_2 z^{-2}} \quad (3)$$

For the purpose of convenience the coefficient $a_0$ is treated separately from Equation 3 by assuming that the input discrete samples are multiplied by $a_0$ before they are applied to the digital filter, so that Equation 3 is rewritten as follows.

$$H(z^{-1}) = a_0 H_1(z^{-1}) \quad (4)$$

$$H_1(z^{-1}) = \frac{1 + a_1 z^{-1} + a_2 z^{-2}}{1 + b_1 z^{-1} + b_2 z^{-2}} \quad (5)$$

In order to guarantee against possible truncation and rounding of digital samples due to wordlength reduction, it is necessary to ensure that the wordlength have a certain limit value. Since the digital equalizer is normally formed by a cascaded combination of filter stages that provide the transfer function of Equation 3 and since the stages that follow the first stage are designed so that their wordlength is twice as large as that of the first stage, no truncation and rounding can occur.

The coefficients $a_1$ and $a_2$ of the equalizer of the aforesaid Japanese Patent Publication are given by $$a_1 = -2 A \cos \psi_z \quad (6)$$

$$a_2 = A^2 \quad (7)$$

where, $A = e^{-\omega_c T \cos \theta}$, $\psi_z = \psi_c T \sin \theta$.

Let us denote $$\left. \begin{array}{l} \alpha_c = \omega_c T \cos \theta \\ \alpha_s = \omega_c T \sin \theta \end{array} \right\} \quad (8)$$

where, $\omega_c$ = angular center frequency and T = sampling interval. Then, A and $\cos \psi_z$ can be expanded as follows:

$$A = 1 - \alpha_c + \frac{\alpha_c^2}{2!} - \frac{\alpha_c^3}{3!} + \ldots + (-1)^n \frac{\alpha_c^n}{n!} \quad (9)$$

$$\cos \psi_z = 1 - \frac{\alpha_s^2}{2!} + \frac{\alpha_s^4}{4!} - \ldots + (-1)^n \frac{\alpha_s^{2n}}{(2n)!} \quad (10)$$

Using Equations 9 and 10 and ignoring the terms smaller than the second-order terms, the following is obtained.

$$A \cos \psi_z = \left(1 - \alpha_c + \frac{\alpha_c^2}{2!} - \frac{\alpha_c^3}{3!}\right)\left(1 - \frac{\alpha_s^2}{2}\right) \quad (11)$$

$$\simeq 1 - \alpha_c - \frac{\alpha_c^2}{2} + \frac{\alpha_s^2}{2}$$

By ignoring the terms smaller than the second-order terms of Equations 9 to 11 on the assumption of that $\omega_c T$ is small, Equations 6 and 7 can be rewritten as follows.

$$\left. \begin{array}{l} a_1 \simeq -2 + 2\alpha_c - (\alpha_c^2 - \alpha_s^2) \\ a_2 \simeq 1 - 2\alpha_c + 2\alpha_s^2 \end{array} \right\} \quad (12)$$

Using the following relations Equation 12 is rewritten to Equation 14:

$$\left. \begin{array}{l} \alpha_1 = a_1 + 2 \\ \alpha_2 = 1 - a_2 \end{array} \right\} \quad (13)$$

$$\left. \begin{array}{l} \alpha_1 = 2\alpha_c - (\alpha_c^2 - \alpha_s^2) \\ \alpha_2 = 2\alpha_c - 2\alpha_c^2 \end{array} \right\} \quad (14)$$

Let us consider the following two cases according to the results of Equation 14:

Case I (where $\alpha_c$ and $\alpha_s$ are sufficiently small): By multiplying Equation 14 with $2^{i-1}$, the following relations hold:

$$\left. \begin{array}{l} \alpha_{1i} = 2^i \{\alpha_c - (\alpha_c^2 - \alpha_s^2)/2\} \\ \alpha_{2i} = 2^i (\alpha_c - \alpha_c^2) \end{array} \right\} \quad (15)$$

where, $$\left. \begin{array}{l} |\alpha_{1i}|, |\alpha_{2i}| < \text{unity} \\ |\alpha_1|, |\alpha_{2i}| \simeq 0 \\ i - 1: \text{effective bit shifts.} \end{array} \right\} \quad (16)$$

Case II (where $\alpha_c$ and $\alpha_s$ are close to unity): By multiplying Equation 14 with $2^{-i-1}$ the following relations hold:

$$\left. \begin{array}{l} \alpha_{1i} = 2^{-i}\{\alpha_c - (\alpha_c^2 - \alpha_s^2)/2\} \\ \alpha_{2i} = 2^{-i}(\alpha_c - \alpha_c^2) \\ i - 1: \text{effective bit shifts.} \end{array} \right\} \quad (17)$$

With the relations specified by Equation 16 manipulation of Equation 15 or 17 allows $\hat{\alpha}_{1i}$ and $\hat{\alpha}_{2i}$ to be represented by quantities sufficiently close to unity. As a result, the coefficients $a_1$ and $a_2$ of Equations 6 and 7 always assume a large value by the manipulation of Equation 15 or 17 and hence the allowable root locations in the z-plane have a high density distribution regardless of the operating parameters of the digital filter, i.e. the center frequency $f_0$, the Q value and the signal level L.

For implementing a digital filter using Equations 15 and 17, a practical value of the quantity i of $2^{i-1}$ or $2^{-i-1}$ is first derived from Equation 13 with operating parameters $f_0$, Q and L as given in the aforesaid Japanese patent publication according to the algorithm given below. In Equation 15 the terms $\alpha_c^2$ and $\alpha_s^2$ can be ignored as $\alpha_c$ and $\alpha_s$ become small in quantity. This also applies to Equation 17 since the result of multiplication with a quantity $2^{-i}$ is actually used for derivation.

Therefore, Equation 14 can be approximated as follows:

$$\left.\begin{array}{l}\alpha_1 \simeq 2\alpha_c \\ \alpha_2 \simeq 2\alpha_c\end{array}\right\} \quad (18)$$

Using Equations 6 and 7 with a reference angular frequency value $\omega_N$ being given, the quantity i conveniently represented by K, the following relations are obtained from $$\left.\begin{array}{l}\alpha_{1i} = 2^{f(i:\omega 0, Q, L)}(2 + a_2) \\ \alpha_{2i} = 2^{f(i:\omega 0, Q, L)}(1 - a_1) \\ f(i:\omega_0, Q, L) = -\dfrac{\omega_{ci} T \cos \theta_i}{\omega_N T \cos \theta_N} + K + 1\end{array}\right\} \quad (19)$$

It will be seen that once a reference transfer function is obtained for $f_N$, Q and L the transfer functions for specific operating parameters can be uniquely obtained.

Consider now a situation in which the transfer function given by Equation 5 has high coefficient sensitivity with a set of typical values $f_0 = 20$ Hz, $Q = 3$, and $L = 12$ dB and a wordlength of 29 bits for each of the coefficient $a_1$, $a_2$, $b_1$, and $b_2$. The decimal equivalents of these coefficients for $f_s = 44.056$ kHz are given as follows:

$$\left.\begin{array}{l}a_1 = -1.999043770134449 \\ a_2 = \phantom{-}0.997634269297123 \\ b_1 = -1.999041527509689 \\ b_2 = \phantom{-}0.999049670994282\end{array}\right\} \quad (20)$$

The decimal values $a_1$ and $a_2$ are represented by 2's complement form as follows:
$a_1 = 10.00\ 0000\ 0000\ 1111\ 1010\ 1010\ 10111$
$a_2 = 00.11\ 1111\ 1101\ 1001\ 0011\ 1101\ 01101$ The binary numbers in the eleventh place et seq. substantially represent the coefficient $a_1$ and those in the ninth place et seq. substantially represent the coefficient $a_2$. The binary notations of $a_1$, $a_2$, $b_1$ and $b_2$ are divided into an integer part and a fractional part and are represented by the summation or subtraction of these two parts as follows:

$a_1 = 10.00\ 0000\ 0000\ 1111\ 1010\ 1010\ 10111$
$\phantom{a_1}= 10.00\ 0000\ 0000\ 0000\ 0000\ 0000\ 00000\ +$
$\phantom{a_1 =}\ 00.00\ 0000\ 0000\ 1111\ 1010\ 1010\ 10111$
$\phantom{a_1}= -2 + \alpha_1 \cdot 2^i \cdot 2^{-1}$ (21a)
$a_2 = 1 - \alpha_2 \cdot 2^i \cdot 2^{-i}$ (21b)
$b_1 = -2 + \beta_1 \cdot 2^j \cdot 2^{-j}$ (22a)
$b_2 = 1 - \beta_2 \cdot 2^j \cdot 2^{-j}$ (22b)

The following relations are given by substituting Equations 21a, 21b, 22a and 22b into Equation 5 and rewriting Equation 5 into the form of a difference equation:

$$\begin{aligned}y_n &= x_n + a_1 \cdot x_{n-1} + a_2 \cdot x_{n-2} - b_1 \cdot y_{n-1} - b_2 \cdot y_{n-2} \quad (23)\\
&= \alpha_1 \cdot x_{n-1} - \alpha_2 \cdot x_{n-2} - \beta_1 \cdot y_{n-1} + \beta_2 \cdot y_{n-2} + \\
&\quad x_n - 2x_{n-1} + x_{n-2} + 2y_{n-1} - y_{n-2}\\
&= 2^{-i}(\alpha_{1i} \cdot x_{n-1} - \alpha_{2i} \cdot x_{n-2} - \beta_{1i} \cdot 2^{i-j} \cdot y_{n-1} + \\
&\quad \beta_{2i} \cdot 2^{i-j} \cdot y_{n-2}) + y_{n2}\\
&= 2^{-i} \cdot y_{n1} + y_{n2}\end{aligned}$$

where, $\hat{\alpha}_{1i} = 2^i \cdot \alpha_1$, $\hat{\alpha}_{2i} = 2^i \cdot \alpha_2$, $\hat{\beta}_{1i} = 2^j \cdot \beta_1$, $\hat{\beta}_{2i} = 2^j \cdot \beta_2$, and $y_{n2} = x_n - 2x_{n-1} + x_{n-2} + 2y_{n-1} - y_{n-2}$.

It will be seen from Equation 23 that the multiplication operation is effected only with respect to the term $y_{n1}$ and that the term $y_{n2}$ is obtained by delay and summation/subtraction and $2^{-i}$ is realized by shifting of digital samples by i bits to the right in a shift register. Furthermore, the coefficients $\hat{\alpha}_{1i}$, $\hat{\alpha}_{2i}$, $\hat{\beta}_{1i}$, $\hat{\beta}_{2i}$ can be obtained by shifting fractions $\alpha_1$, $\alpha_2$, $\beta_1$ and $\beta_2$ by i bits (if $i=j$) to the left and can be represented substantially by $(29-i+j)$ bits. Therefore, from Equations 21a, 21b, 22a, 22b, and 23 the coefficients $\alpha_{1i}$, $\alpha_{2i}$, $\beta_{1i}$, $\beta_{2i}$ can be represented apparently by $(16+i-1)$ bits (where, $i-1$ represents the effective quantity of bit shift).

Figure 3:
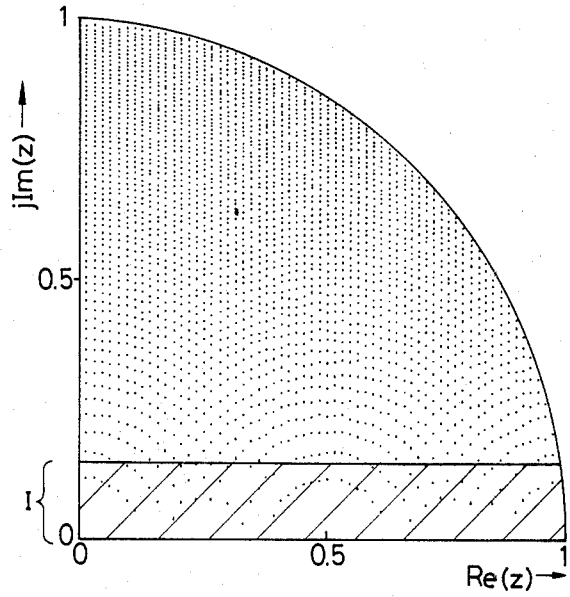
FIG. 3 shows the characteristic of a typical IIR filter in terms of root positions on the z-plane as a result of coefficient quantization.

Since Equation 23 is realized by effecting rightward i-bit shift after the derivation of the term $y_{n1}$ and then additing the term $y_{n2}$, $(32+i-j)$ bits are obtained if the input digital samples have a wordlength of 16 bits. Therefore, the coefficient wordlength of the digital filter of the invention can be approximated by a substantially infinite wordlength in the hatched area I of FIG. 3 where the allowable root locations have a low density distribution. It is thus possible to universally realize the equalization of frequency response characteristics with low coefficient sensitivity. Truncation and rounding problems which might arise due to multiplication operations are eliminated. It is further possible to provide a coefficient having a sufficient amount of information which occurs in areas close to $z = 0$ making i negative in Equation 23.

The general concept of the digital filter of the invention will now be considered. IIR digital filters are generally designed to meet the following Equation:

$$\sum_{K=0}^{N} b_K \cdot y_{(n-K)} = \sum_{K=0}^{M} a_K \cdot x_{(n-K)} \quad (24)$$

where, $a_K$ and $b_K$ are multiplying factors.

According to the invention, the multiplying factors $a_K$ and $b_K$ are expressed as follows:

$$a_K = A_K \pm \hat{\alpha}_{Ki} \cdot 2^{-i}$$

$$b_K = B_K \pm \hat{\beta}_{Ki} \cdot 2^{-j}$$

where, $A_K$ and $B_K$ are integers, $\hat{\alpha}_{Ki} \cdot 2^{-i}$ and $\hat{\beta}_{Ki} \cdot 2^{-j}$ are fractions, and i, j are constants Thus, Equation 23 can be generalized as follows:

$$\sum_{K=0}^{N} B_K \cdot y_{(n-K)} = \sum_{K=0}^{M} A_K \cdot x_{(n-K)} \pm \quad (25)$$

$$2^{-i}\left(\sum_{K=0}^{M} \hat{\alpha}_{Ki} \cdot x_{(n-K)} \mp \sum_{K=0}^{N} \hat{\beta}_{Ki} \cdot 2^{i-j} \cdot y_{(n-K)}\right)$$

where, $\pm \hat{\alpha}_{Ki}$ and $\pm \hat{\beta}_{Ki}$ are multiplying factors.

Description will now be concerned with practical embodiments of the present invention. All the embodiments of IIR digital filters shown in the drawings are provided with a controller which controls, in the usual manner, the writing in, shifting and reading of samples as well as the operation of multipliers and adders. This controller which is obvious for one skilled in the art, is not shown for simplicity.

Figure 4:
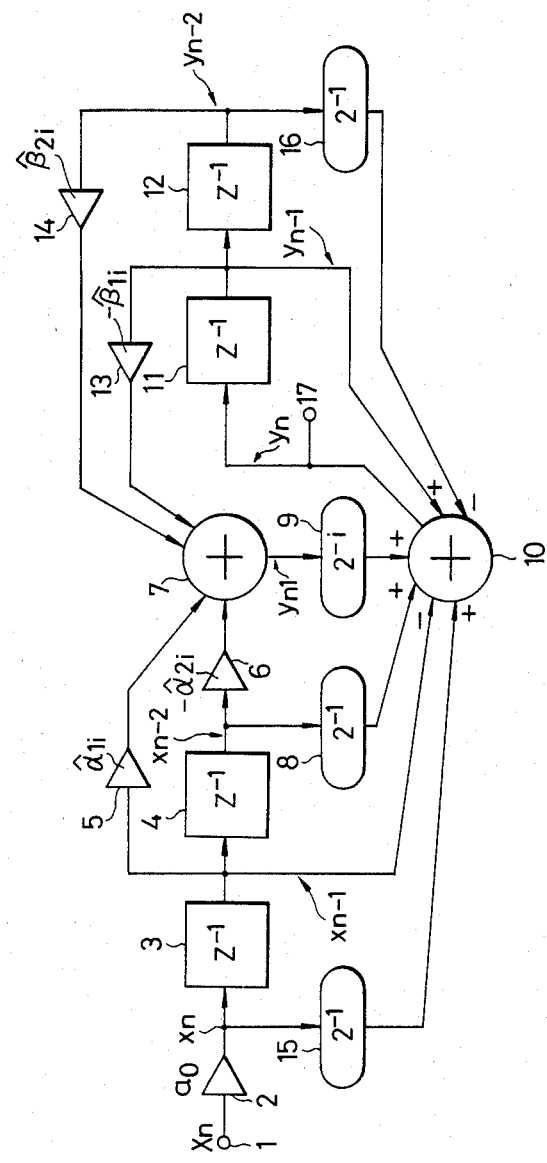
FIG. 4 shows a block diagram of a first preferred embodiment of the invention.

FIG. 4 is an illustration of a block diagram of a first embodiment of the IIR digital filter of the invention. For convenience, it is assumed that $i=j$, $M=N=2$, and $a_0=b_0=1$ in Equation 24. A sequence of input discrete samples $x_n$ is applied to an input terminal 1 at time nT and multiplied by coefficient $a_0$ in a multiplier 2 and fed to a unit delay circuit 3 in which the digital samples are delayed by a unit sampling interval T and thence to an adder-subtractor, or combiner 10. A sequence of delayed discrete samples represented by $x_{n-1}$ is supplied from the delay circuit 3 to a multiplier 5 where it is multiplied by a coefficient $\hat{\alpha}_{1i}$ to feed a signal $\hat{\alpha}_{1i}x_{n-1}$ to an adder 7. A unit delay circuit 4 further delays the signal $x_{n-1}$ by a unit sampling interval to feed a signal $x_{n-2}$ to a multiplier 6 having a coefficient $-\hat{\alpha}_{2i}$, a signal $-\hat{\alpha}_{2i}x_{n-2}$ being applied to the adder 7. A sequence of output digital samples $y_n$ is supplied from the adder-subtractor 10 to a series combination of unit delay circuits 11 and 12 and applied as samples $y_{n-1}$ and $y_{n-2}$ respectively to multipliers 13 and 14. The samples $y_{n-1}$ and $y_{n-2}$ are multiplied by coefficients $-\hat{\beta}_{1i}$ and $\hat{\beta}_{2i}$ respectively in the multipliers 13 and 14 and applied as samples $-\hat{\beta}_{1i}y_{n-1}$ and $\hat{\beta}_{2i}y_{n-2}$ to the adder 7. Thus, the adder 7 generates a sequence of output digital samples represented by the term $y_{n1}$ of Equation 23 and feeds it to a shift register 9 where the output samples $y_{n1}$ are shifted by i bits to the right. This i-bit rightward shifting has the effect of multiplying the input value by a coefficient $2^{-i}$. The output of the shift register 9 is applied to an additive input terminal of the adder-subtractor 10.

For purposes of disclosure the term $y_{n2}$ of Equation 23 is normalized by 2. Since the coefficients $a_1$, $a_2$, $b_1$, $b_2$ are represented by 2's complement terms $x_n$, $x_{n-1}$ and $y_{n-2}$ need to be multiplied by a coefficient $\frac{1}{2}$ which can be realized by shifting by one bit to the right. For this reason, output samples $x_n$, $x_{n-1}$ and $y_{n-2}$ from the multiplier 2 and delay circuits 4 and 12 are coupled to shift registers 15, 8, and 16, respectively, to be shifted by one bit to the right. The outputs of the shift registers 15 and 8 are coupled to additive inputs of the adder-subtractor 10 while the output of shift register 12 is coupled to a subtractive input of the adder-subtractor 10. Since terms $-2x_{n-1}$ and $2y_{n-1}$ of the second term $y_{n2}$ of Equation 23, which are respectively available from the delay circuits 3 and 11, are normalized to $-x_{n-1}$ and $y_{n-1}$, they need no bit shifting and are thus applied directly from delay circuits 3 and 11 to corresponding inputs of the adder-subtractor 10. Therefore, the adder-subtractor 10 is supplied with all the terms of the second term $y_{n2}$ of Equation 23 and arithmetically combines them with the term $2^{-i}y_{n1}$ from the shift register 9 to provide the output samples $y_n$ for application to the delay circuit 11 which appear at an output terminal 17 for utilization by an external circuit.

Summarizing the operation of the digital filter of FIG. 4, the adder 7 is supplied with a plurality of first feedforward signals from the multipliers 5 and 6 and a plurality of second feedback signals from the multipliers 13 and 14. The adder-subtractor 10 is, on the other hand, supplied with a plurality of second feedforward signals from the shift registers 15 and 8 and the delay circuit 3 and a plurality of second feedback signals from the delay circuit 11 and shift register 16. The first feedforward signals are derived by successively delaying and scaling the input samples $x_n$ by coefficients $\alpha_{1i}$ and $-\alpha_{2i}$ and the first feedback signals are derived by successively delaying and scaling the output samples $y_n$ by coefficients $\beta_{1i}$ and $\beta_{2i}$. The second feedforward signals are derived by successively delaying and shifting the input samples $x_n$ by selected values. Similarly, the second feedback signals are derived by successively delaying and shifting the output samples $y_n$ by selected values. The adder 7 provides samples $y_{n1}$ in response to the combining of the first feedforward and first feedback signals for application to the shift register 9 to generate samples $2^{-i}y_{n1}$.

Figure 5:
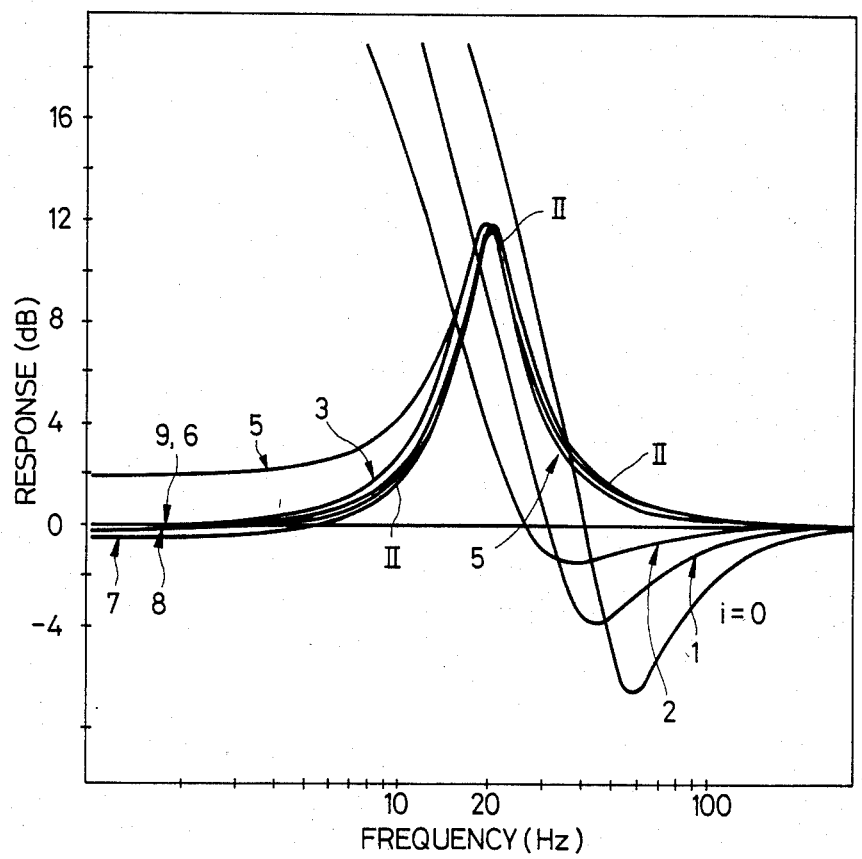
FIGS. 5 and 6 show the frequency response characteristics for various bit shifts.
Figure 6:
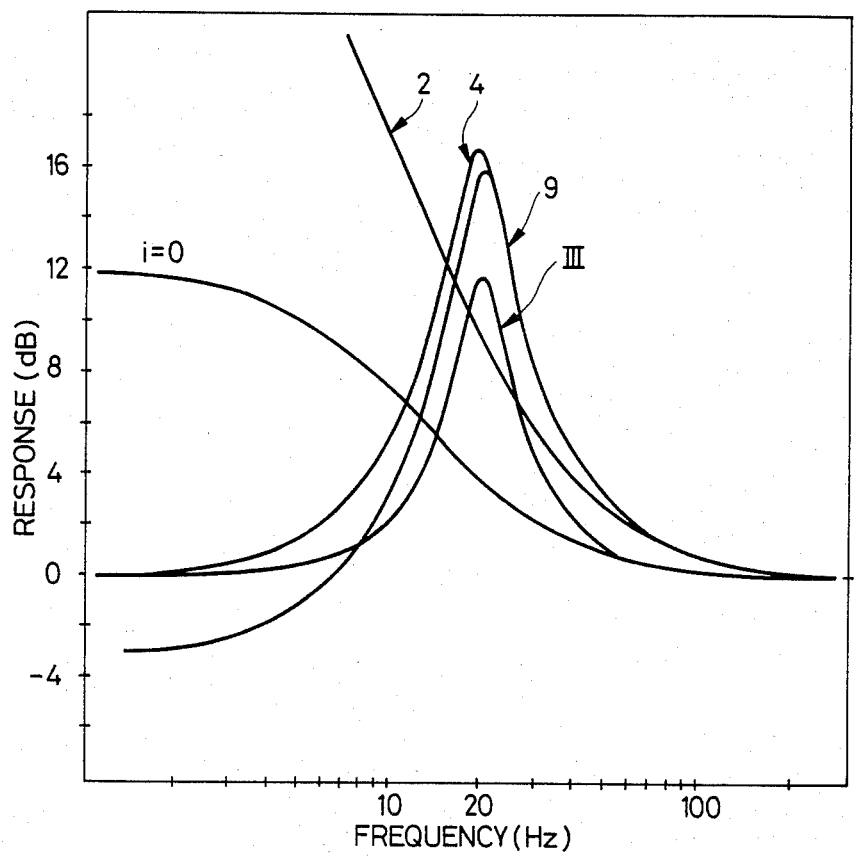

FIG. 5 is an illustration of the frequency response characteristics of a digital filter structure constructed according to the transfer function of Equation 3 for different amounts of bit shift i with $f_o=20$ Hz, $Q=3$ and $L=12$ dB at $f_o$ in which the curve II represents an ideal characteristic for a finite coefficient wordlength. FIG. 6 is an illustration of the frequency response characteristics of the digital filter similar to the curves of FIG. 5 with the exception that the numerator of the transfer function of Equation 3 is multiplied by the coefficient $a_0$. Th curve III in FIG. 6 represents an ideal characteristic for a finite coefficient wordlength.

Figure 7:
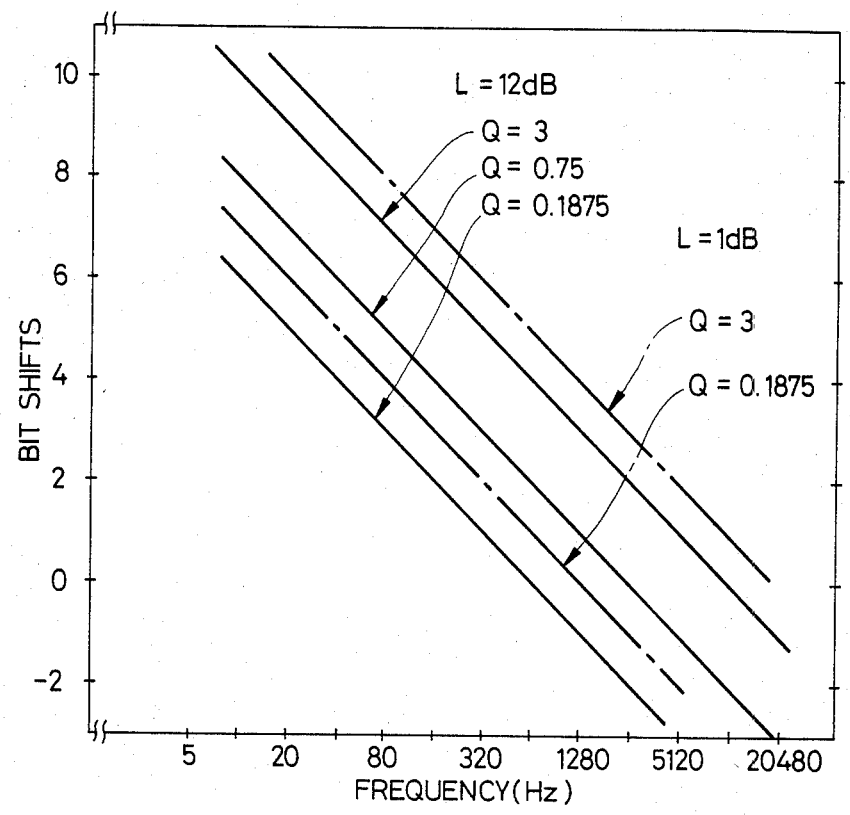
FIG. 7 shows a plot of bit shifts as a function of frequency.

FIG. 7 is a plot of bit shifts as a function of frequency. Single peak equalization characteristics are indicated by solid lines for a peak level L of 12 dB with Q values being at 3, 0.75 and 0.1875, while the same characteristics for a peak level of 1 dB with Q values 3 and 0.1875 are indicated by dot-and-dash lines. As illustrated, the amount of bit shift decreases by 1 bit as he frequency is doubled.

Figure 1B:
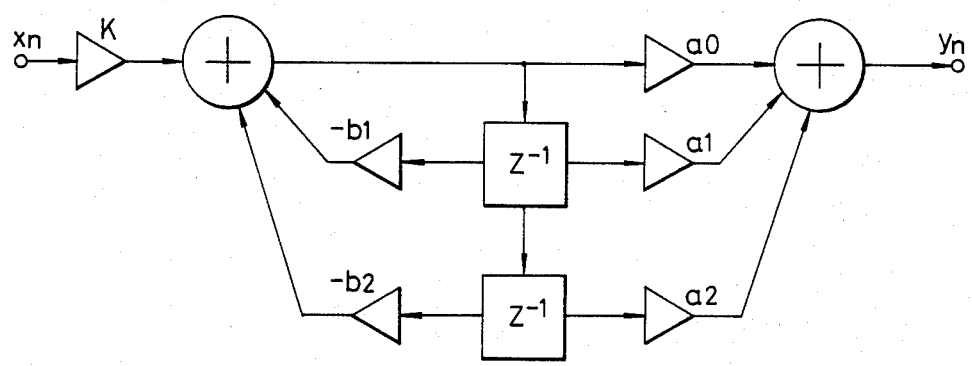
Figure 2:
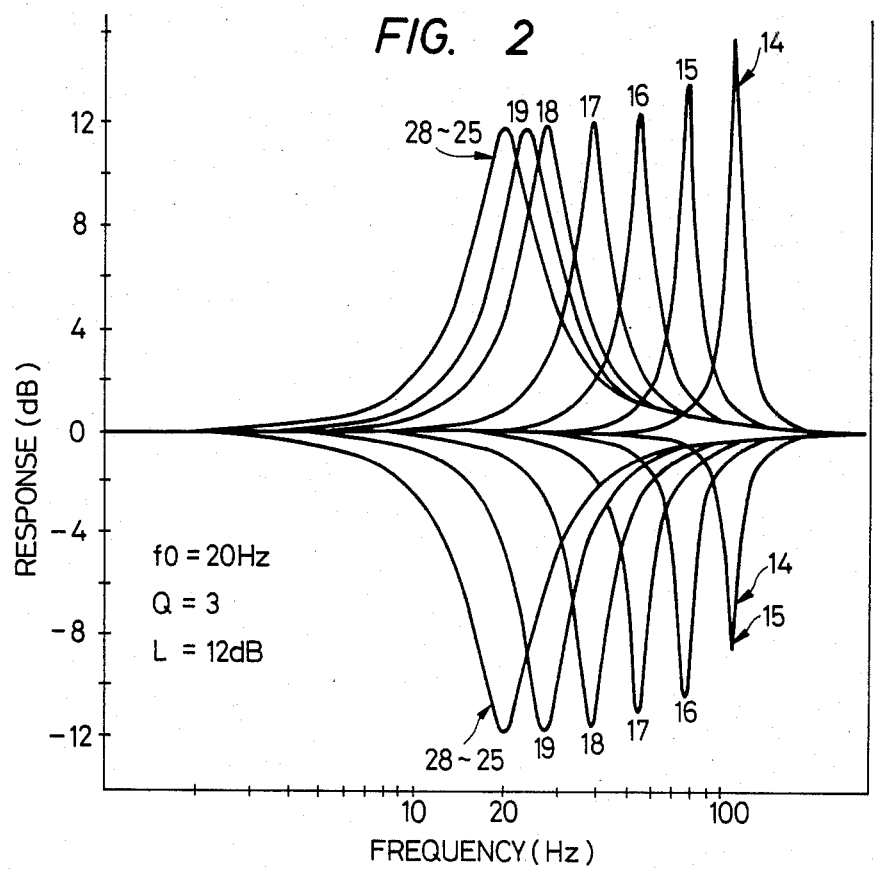
FIG. 2 shows the frequency response curves of a typical IIR digital filter for different values of coefficient wordlength.

Comparison of the first embodiment of the invention is made with respect to the prior art on the assumption that the multipliers 2, 5, 6, 13 and 14 of the invention are of a 16×16 bit structure and the input digital samples comprise a 32-bit sequence with a 16-bit coefficient wordlength. Since the multiplier 2 provides multiplication of the 32-bit input digital samples with a 16-bit coefficient word $a_0$ to generate a sequence of 32-bit output digital samples, the multiplication involves two operations. Likewise, the 32-bit digital samples applied to multipliers 5, 6, 13 and 14 are each multiplied by a 16-bit coefficient word, so that two multiplication operations are involved in each multiplier. Therefore, a total of 10 multiplication operations is involved in the digital filter. The adder 7 provides eight additive operations and the adder-subtractor 10 provides seven additive and subtractive operations. The digital filter thus provides a total of 15 additive/subtractive operations. The shift registers 8, 15 and 16 each provide a single bit shift operation, while the shift register 9 provides bit shifting twice, and therefore, there is a total of five bit shift operations. On the other hand, the direct form IIR digital filter of FIG. 1a provides a total of twenty multiplication operations since each of the coefficients $a_0$, $a_1$, $-b_1$ and $-b_2$ is represented by a 32-bit word and the associated multipliers each comprise 16×16 bits and the 32-bit input digital samples $x_n$ and $y_n$ so that each multiplier provides four multiplication operations for a total of twenty multiplication operations. Likewise, a total of twenty additive operations is required. In the case of the cononical IIR digital filter of FIG. 1b, the 16×16 bit multipliers each provide four multiplications with a total of twenty-four multiplications and each of the two adders provides twelve additive operations. The comparison just described above is summarized in the table given below.

| DIGITAL FILTERS | MULTIPLICATION | SUMMATION | BIT SHIFT |
|---|---|---|---|
| Direct | 20 | 20 | 0 |
| Canonical | 24 | 24 | 0 |
| Invention | 10 | 15 | 5 |

As is apparent from the above the invention favorably compares with the prior art IIR digital filters. It is to be noted that the table shown above is made on the assumption that a plurality of circuits having the transfer function of Equation 3 is cascaded and that the operating terms for maintaining the signal quality have a two times higher degree of precision.

Figure 8:
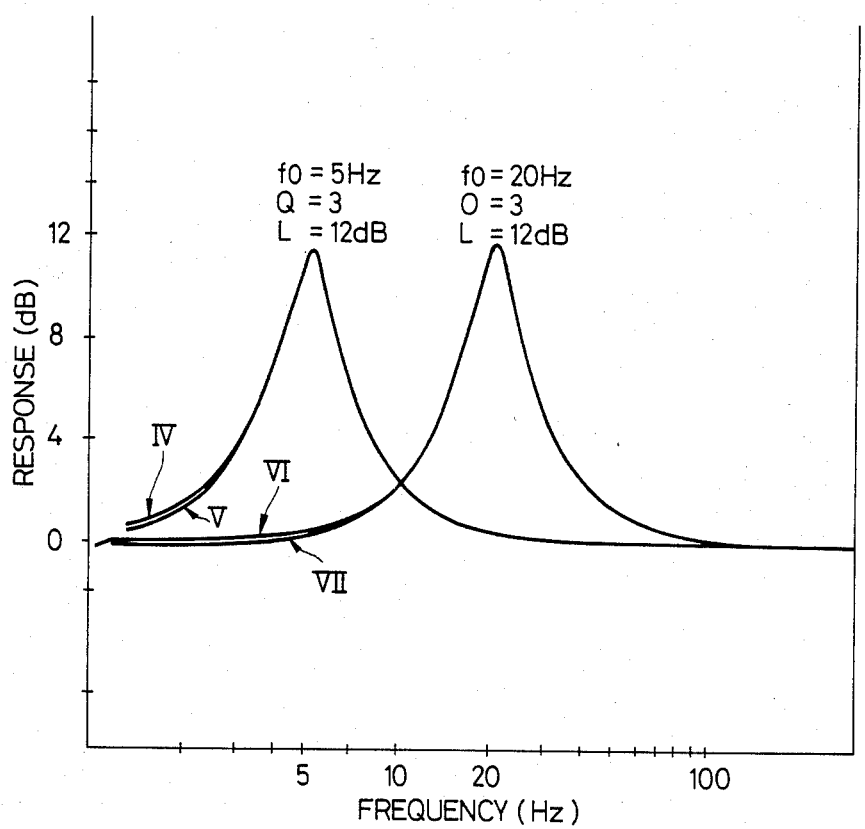
FIG. 8 shows the frequency response characteristics of the filter of FIG. 4 for purposes of comparison with the ideal curves.

Further comparisons are made with respect to ideal filter characteristics. In FIG. 8, the curves IV and VI indicate ideal characteristics for different filter parameters, while the curves V and VII depict the characteristic of the digital filter of the invention having the same operating parameters. It is shown that the ideal filter characteristic can be closely approximated.

Figure 9:
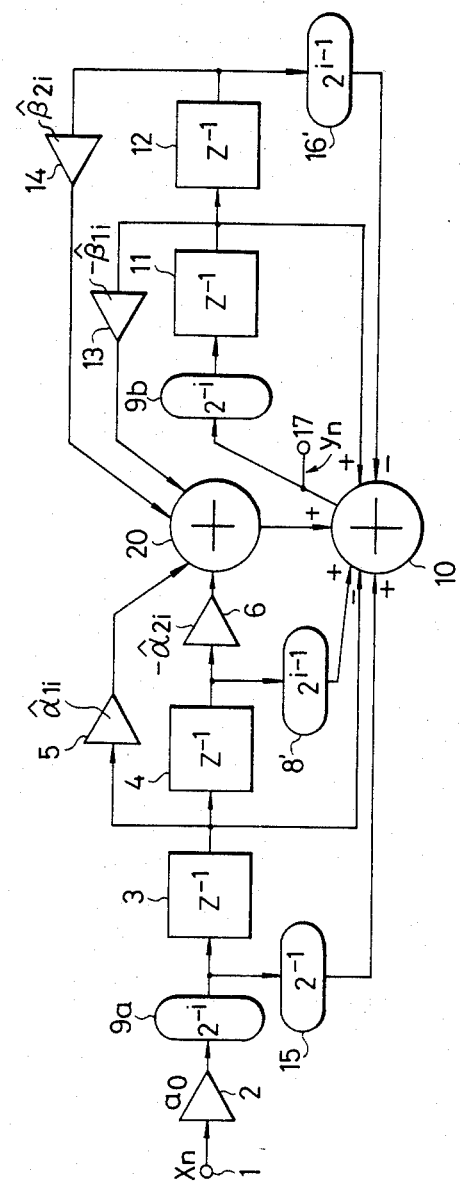
FIG. 9 shows a second embodiment of the invention.

A second embodiment of the IIR digital filter according to the present invention is illustrated in FIG. 9 in which parts corresponding to those in FIG. 4 are marked by like numerals. The second embodiment differs from the first embodiment in that after multiplication in the multiplier 2 the input digital samples are applied to a shift register 9a to be shifted by i bits to the right, whereas in the first embodiment the i bit shifting is effected by the shift register 9 connected to the output of the adder 7.

A sequence of output digital samples from the shift register 9a is applied on the one hand to shift register 15 for one-bit shifting to the right and thence to an additive input of adder-subtractor 10 and on the other hand to the delay circuits 3 and 4. The output of the delay circuit 4 is applied to shift register 8' which provides shifting of i-1 bits to the left so that the samples $2^{-i}x_{n-2}$ are multiplied by a factor $2^{i-1}$ and applied as $2^{-1}x_{n-2}$ to the adder-subtractor 10. The latter applies its output digital samples $y_n$ to a shift register 9b in which the samples are shifted by i bits to the right before they are applied to the delay circuit 11. The output digital samples from the delay circuit 12 are shifted by i-1 bits to the left in a shift register 16' and fed to a subtractive input of the adder-subtractor 10. Therefore, the adder-subtractor 10 receives the digital samples corresponding to the term $y_{n2}$ from the outputs of shift registers 15, 8', 16', and delay circuits 3 and 11.

On the other hand, the adder 7 provides output samples representing the term $2^{-i}\cdot y_{n1}$ in response to the combining of input samples from multipliers 6, 5, 13 and 14 for application to an additive input of the adder-subtractor 10 in which it is combined with the term $y_{n2}$ to provide the output samples $y_n$ to output terminal 17. Although the signal quality of the second embodiment is slightly poor by comparison with the first embodiment due to the provision of the shift register 9a in the input section of the digital filter, it is apparent that a digital filter having a desired equalization characteristic and low coefficient sensitivity can be realized with a small coefficient wordlength as in the previous embodiment.

Figure 10:
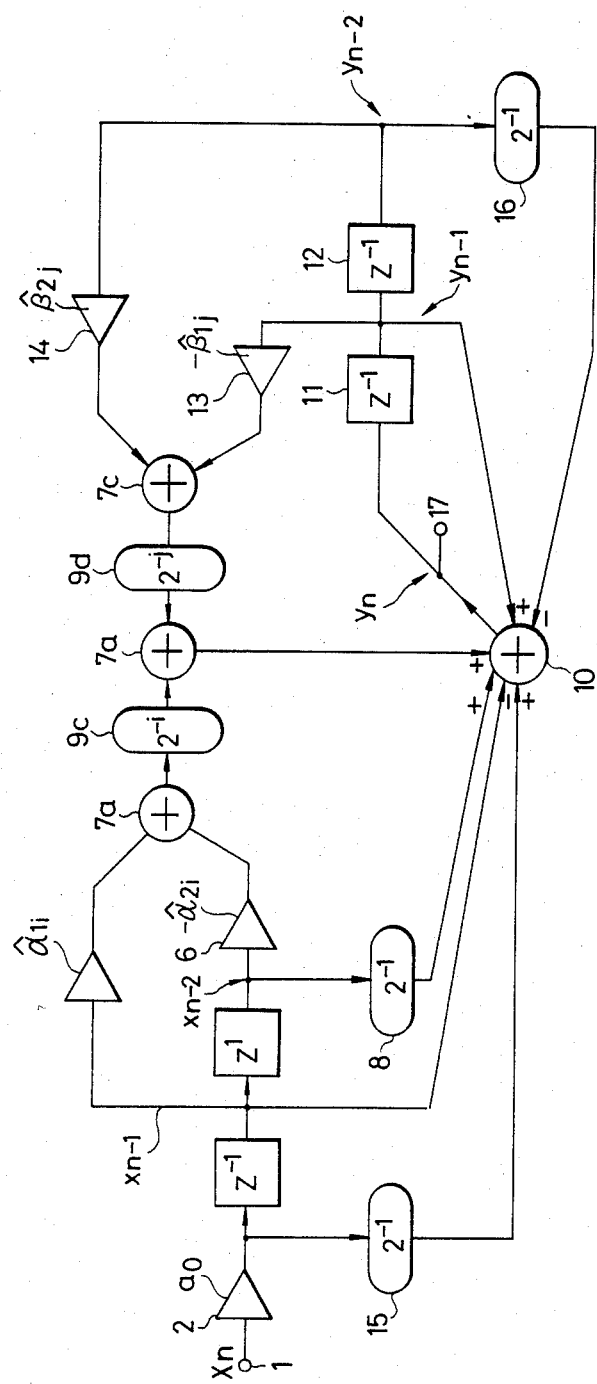
FIG. 10 shows a third embodiment of the invention.

FIG. 10 is an illustration of a third embodiment of the present invention. This embodiment differs from the previous embodiments in that the adder 7 is formed by adder sections 7a, 7b and 7c and the shift register 9 is replaced by shift registers 9c and 9d. The first feedforward signals from multipliers 5 and 6 are combined in the adder 7b into a combined feedforward signal and applied to the shift register 9c. The first feedback signals from multipliers 13 and 14 are combined in the adder 7c into a combined feedback signal and applied to the shift register 9c. The shift register 9c is arranged to shift the samples from the adder 7b by i bits to the left, while the shift register 9d is arranged to shift the samples from the adder 7c by j bits to the left. The i-bit and j-bit shifted samples are combined in the adder 7a and applied to the adder-subtractor 10.

In each of the previous embodiments where the digital samples $x_n$ are assumed to comprises 32 bits, an eliminator circuit may be provided to cut off the 48 bit digital samples which are derived from the multiplier 2 as a result of the multiplication by the 16-bit coefficient $a_0$, to a sequence of 32 bits.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. An Infinite Impulse Response digital filter comprising: a plurality of first feedforward circuits for successively delaying and scaling input discrete samples $x_n$ by selected values of filter coefficient, a plurality of first feedback circuits for successively delaying and scaling output discrete samples $y_n$ by selected filter coefficient values, first combining means arranged to receive discrete samples from said first feedforward and feedback circuits to provide a first signal representative of a decimal fractional part of the filter coefficient, a plurality of second feedforward circuits for successively delaying and shifting said input discrete samples $x_n$ by selected values, a plurality of second feedback circuits for successively delaying and shifting said output discrete samples $y_n$ by selected values, second combining means arranged to receive discrete samples from said second feedforward and feedback circuits to provide a second signal representative of an integer part of the filter coefficient, said first and second signals being combined in the second combining means to provide the output samples $y_n$, and bit shifting means provided for shifting discrete samples which appear in any one of circuits to said feedforward, feedback and combining means so that said first signal is shifted by a predetermined value.

2. An Infinite Impulse Response digital filter for filtering a digital input signal representative of a sequence of discrete samples $x_n$ to generate a sequence of discrete output samples $y_n$ according to a transfer function represented by $$\sum_{K=0}^{N} b_K \cdot y_{(n-K)} = \sum_{K=0}^{M} a_K \cdot x_{(n-K)}$$

where, $a_K$ and $b_K$ are weighting factors given by $$a_K = A_K \pm \hat{\alpha}_{Ki} 2^{-i}$$
$$b_K = B_K \pm \hat{\beta}_{Ki} 2^{-j}$$

where, $A_K$ and $B_K$ are integers, $\hat{\alpha}_{Ki} 2^{-i}$ and $\hat{\beta}_{Ki} 2^{-j}$ are fractions, $\hat{\alpha}_{Ki}$ and $\hat{\beta}_{Ki}$ are weighting factors, and i, j are constants, whereby said transfer function is rewritten as $$\sum_{K=0}^{N} B_K \cdot y_{(n-K)} = \sum_{K=0}^{M} A_K \cdot x_{(n-K)} \pm$$

$$2^{-i} \left( \sum_{K=0}^{M} \hat{\alpha}_{Ki} \cdot x_{(n-K)} \pm \sum_{K=0}^{N} \hat{\beta}_{Ki} \cdot 2^{i-j} \cdot y_{(n-K)} \right)$$

said digital filter comprising:
first feedforward means for successively delaying and scaling said input signal by selected values $\hat{\alpha}_{Ki}$ to provide a plurality of first feedforward signals;
first combining means for providing a first combined signal representing $$2^{-i} \left( \sum_{K=0}^{M} \hat{\alpha}_{Ki} \cdot x_{(n-K)} \pm \sum_{K=0}^{N} \hat{\beta}_{Ki} \cdot 2^{i-j} \cdot y_{(n-K)} \right)$$

in response to the combining of said first feedforward signals and a plurality of first feedback signals;
second feedforward means for successively delaying and shifting said input signal $x_n$ by selected values to provide a plurality of second feedforward signals;
second combining means for providing a second combined signal representing $$\sum_{K=0}^{N} B_K \cdot y_{(n-K)} \pm \sum_{K=0}^{M} A_K \cdot x_{(n-K)}$$

in response to the combining of said second feedforward signals and a plurality of second feedback signals and providing said output signal $y_n$ in response to the combining of said first and second combined signals;
first feedback means coupled to said first combining means for successively delaying and scaling said first combined signal by selected values $\hat{\beta}_{Ki}$ to provide said first feedback signals;
second feedback means coupled to said second combining means for successively delaying and shifting said second combined signal by selected values to provide said second feedback signals; and
bit shifting means arranged to shift discrete samples which occur in any one of circuits to said feedforward, feedback and combining means so that said first combined signal is shifted by a predetermined value.

3. An Infinite Impulse Response digital filter as claimed in claim 2, wherein said first feedforward means comprises:
a first feedforward circuit including first and second feedforward delay circuits connected in series for respectively providing a unit delay time to said input signal $x_n$;
a second feedforward circuit including a first multiplier coupled to the output of said first delay circuit for scaling discrete samples therefrom by a selected value $\hat{\alpha}_{Ki}$ to provide a first one of said first feedforward signals and a second multiplier coupled to the output of said second delay circuit for scaling discrete samples therefrom by a selected value $\hat{\alpha}_{Ki}$ to provide a second one of said first feedforward signals, and
wherein said second feedforward means comprises:
a third feedforward circuit including a shift register for shifting the input discrete samples $x_n$ by a selected value to provide a first one of said second feedforward signals;
a fourth feedforward circuit coupled to the output of said first delay circuit to provide a second one of said second feedforward signals; and
a fifth feedforward circuit including a shift register coupled to the output of said second delay circuit for shifting discrete samples therefrom by the selected values to provide a third one of said second feedforward signals.

4. An Infinite Impulse Response digital filter as claimed in claim 2 or 3, wherein said first feedback means comprises:
a first feedback circuit including first and second feedback delay circuits connected in series for respectively providing a unit delay time to said first combined signal; and
a second feedback circuit including a first multiplier coupled to the output of said first feedback delay circuit for scaling discrete samples therefrom by the selected values $\hat{\beta}_{Ki}$ to provide a first one of said first feedback signals and a second multiplier coupled to the output of said second feedback delay circuit for scaling discrete samples therefrom by a selected value $\hat{\beta}_{Ki}$ to provide a second one of said first feedback signals, and
wherein said second feedback means comprises:
a third feedback circuit coupled to the output of said first feedback delay circuit to provide a first one of said second feedback signals; and
a fourth feedback circuit including a shift register coupled to the output of said second feedback delay circuit for shifting discrete samples therefrom by a selected value to provide a second one of said second feedback signals.

5. An Infinite Impulse Response digital filter as claimed in claim 4, wherein said bit shifting means comprises a shift register coupled between said first and second combining means for shifting discrete samples from the first combining means by a selected value to provide shifted discrete samples to said second combining means (10).

6. An Infinite Impulse Response digital filter as claimed in claim 4, wherein said bit shifting means comprises a shift register provided in said first feedforward circuit for shifting the input discrete samples by a selected value to provide shifted input discrete samples to said first feedforward delay circuit and to the shift register of said third feedforward circuit.

7. An Infinite Impulse Response digital filter as claimed in claim 2, wherein said bit shifting means comprises a first shift register arranged to shift said first feedforward signals by i bits in a value decreasing direction and a second shift register arranged to shift said first feedback signals by j bits in a value decreasing direction.

8. An Infinite Impulse Response digital filter as claimed in claim 1 or 2, wherein said first combining means comprises an adder and said second combining means comprises an adder-subtractor.

* * * * *